(12) United States Patent
Sun et al.

(10) Patent No.: US 12,527,174 B2
(45) Date of Patent: Jan. 13, 2026

(54) DISPLAY SUBSTRATE AND MANUFACTURING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Kaipeng Sun, Beijing (CN); Yudiao Cheng, Beijing (CN); Yue Long, Beijing (CN); Benlian Wang, Beijing (CN); Doyoung Kim, Beijing (CN); Hai Zheng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 276 days.

(21) Appl. No.: 17/788,614

(22) PCT Filed: Aug. 16, 2021

(86) PCT No.: PCT/CN2021/112656
§ 371 (c)(1),
(2) Date: Jun. 23, 2022

(87) PCT Pub. No.: WO2022/068428
PCT Pub. Date: Apr. 7, 2022

(65) Prior Publication Data
US 2023/0225173 A1    Jul. 13, 2023

(30) Foreign Application Priority Data
Sep. 29, 2020 (CN) .......................... 202011057999.5

(51) Int. Cl.
*H10K 59/80* (2023.01)
*H10K 59/12* (2023.01)
(Continued)

(52) U.S. Cl.
CPC ....... *H10K 59/131* (2023.02); *H10K 59/1201* (2023.02); *H10K 59/80* (2023.02); *H10K 59/873* (2023.02); *H10K 59/65* (2023.02)

(58) Field of Classification Search
CPC .. H10K 59/131; H10K 59/1201; H10K 59/80; H10K 59/873; H10K 59/65; H10K 71/621; H10K 59/124; H01L 21/77
(Continued)

(56) References Cited

U.S. PATENT DOCUMENTS

2021/0028249 A1   1/2021   Ding et al.
2022/0310724 A1   9/2022   Hu et al.

FOREIGN PATENT DOCUMENTS

CN   110246984 A   9/2019
CN   110265583 A   9/2019
(Continued)

OTHER PUBLICATIONS

Deng, L., CN-111627971-A—description translation with paragraph numbers (Year: 2020).*
(Continued)

*Primary Examiner* — Bumsuk Won
(74) *Attorney, Agent, or Firm* — IPro, PLLC (57) ABSTRACT

Display substrate, method for manufacturing the same and display device are provided. The display substrate includes a base substrate comprising a hole region, an isolation region surrounding the hole region, and a display region surrounding the isolation region. At least one isolation pillar is provided within the isolation region, and each isolation pillar is arranged at a perimeter surrounding the hole region.
(Continued)

A light-emitting layer covering the isolation pillar is provided in the display region and the isolation region, and the isolation pillar separates the light-emitting layer located between the hole region and the display region. The isolation pillar includes: a plurality of layers of metal patterns sequentially arranged in a stack on the base substrate; and an insulating film layer which is a layer stack covering the metal patterns and has a shape conforming to shapes of the metal patterns. The display substrate, the method for manufacturing the same, and the display device provided by the present disclosure enables reduced masks, reduced costs and simplified process.

17 Claims, 3 Drawing Sheets (51) Int. Cl.
*H10K 59/131* (2023.01)
*H10K 59/65* (2023.01)

(58) Field of Classification Search
USPC .......................................................... 257/40
See application file for complete search history.

(56) References Cited

FOREIGN PATENT DOCUMENTS

| CN | 111180465 A | | 5/2020 | |
|---|---|---|---|---|
| CN | 111244112 A | * | 6/2020 | ......... H01L 27/1218 |
| CN | 111293148 A | | 6/2020 | |
| CN | 111627971 A | * | 9/2020 | ......... H01L 27/3234 |

OTHER PUBLICATIONS

Zhou Y, CN-111244112-A,—description translation with paragraph numbers (Year: 2020).*
CN 202011057999.5 first office action.
PCT/CN2021/112656 international search report and written opinion.

* cited by examiner

DISPLAY SUBSTRATE AND MANUFACTURING METHOD THEREFOR, AND DISPLAY DEVICE

CROSS-REFERENCE TO RELATED APPLICATIONS

The present application is the U.S. national phase of PCT Application No. PCT/CN2021/112656 filed on Aug. 16, 2021, which claims priority to Chinese Patent Application No. 202011057999.5 filed in China on Sep. 29, 2020, the disclosure of which is hereby incorporated by reference in its entirety.

TECHNICAL FIELD

The present disclosure relates to the technical field of display, and in particular, to a display substrate, a method for manufacturing the same, and a display device.

BACKGROUND

At present, full screen display has become a trend, and consumers have strong demand for narrow frame, ultra-narrow frame and even non-frame display products. In order to further increase the screen-to-body ratio, an AA Hole design, i.e., a design in which a hole is provided in the active display area (Active Area, AA), has been used in the screen for various display products, such that a camera and other sensors can be disposed under the hole in AA, thereby narrowing the frame of the screen and increasing the screen-to-body ratio.

In the related art, in a screen with the AA Hole design, the frame structure near the hole generally includes isolation pillars, and the isolation pillars are mainly for isolating water and oxygen from entering the display region via the cutting position of the hole, so as to protect the organic light-emitting material (Electro-Luminescence, EL layer) in the display region from being affected. At present, the inner and outer isolation pillars of the AA Hole are formed by etching an inorganic layer away with an electron beam mask (EB Mask). A separate design of EB mask is required for such a structure, so that the quantity of masks used in the manufacturing process is large, the cost is high and the process is complex.

SUMMARY

In order to address the above issue, the present disclosure provides a display substrate, a method for manufacturing the same, and a display device, which can reduce the quantity of masks, reduce costs and simplify processing.

In order to achieve the above object, the present disclosure provides the following technical solutions.

An embodiment of the present disclosure provides a display substrate, including a base substrate, the base substrate includes a hole region, an isolation region surrounding the hole region, and a display region surrounding the isolation region, at least one isolation pillar is provided within the isolation region, and each isolation pillar is arranged at a perimeter surrounding the hole region; a light-emitting layer covering the isolation pillar is provided in the display region and the isolation region, and the at least one isolation pillar separates the light-emitting layer at a location between the hole region and the display region; wherein the at least one isolation pillar includes an insulating film layer, and a plurality of layers of metal patterns stacked sequentially on the base substrate; and the insulating film layer is a stack of layers covering the plurality of layers of metal patterns, a shape of the stack of layers conforms to a shape of the plurality of layers of metal patterns.

Illustratively, the plurality of layers of metal patterns include: a first metal pattern, a second metal pattern and a third metal pattern which are stacked sequentially from a side close to the base substrate to a side away from the base substrate;

the display region is provided with a thin film transistor, and the thin film transistor includes a gate electrode, a source electrode, and a drain electrode; and at least one of the first metal pattern, the second metal pattern and the third metal pattern is arranged in the same layer and made of the same material as the gate electrode, and at least another one of the first metal pattern, the second metal pattern and the third metal pattern is arranged in the same layer and made of the same material as the source electrode and the drain electrode.

Illustratively, the display region includes a first gate metal pattern and a second gate metal pattern which are arranged in a stack, and at least one of the first gate metal pattern and the second gate metal pattern is the gate electrode;

the first metal pattern is arranged in the same layer and made of the same material as the first gate metal pattern;

the second metal pattern is arranged in the same layer and made of the same material as the second gate metal pattern; and the third metal pattern is arranged in the same layer and made of the same material as the source electrode and the drain electrode.

Illustratively, the insulating film layer includes a first insulating layer and a second insulating layer, the first insulating layer is located between the first metal pattern and the second metal pattern, and the second insulating layer is located between the second metal pattern and the third metal pattern; wherein at least one of the first insulating layer and the second insulating layer includes a gate insulating layer, and at least another one of the first insulating layer and the second insulating layer includes an inter-level dielectric layer and a buffer layer.

Illustratively, the isolation pillar includes a first side and a second side, the first side is a side close to the display region, and the second side is a side close to the hole region; and in the at least one isolation pillar, radial widths of layers of metal patterns in a direction parallel to the base substrate gradually reduce from the side close to the base substrate to the side away from the base substrate, such that a plurality of steps is formed at the first side and the second side.

Illustratively, at the first side, a difference between radial widths of metal steps formed by two adjacent metal patterns in the direction parallel to the base substrate is greater than or equal to 1 micron; and at the second side, a difference between radial widths of metal steps formed by two adjacent metal patterns in the direction parallel to the base substrate is greater than or equal to 1 micron.

Illustratively, at least two isolation pillars including the at least one isolation pillar are provided in the isolation region, the at least two isolation pillars include an inner isolation pillar and an outer isolation pillar, the inner isolation pillar is located at a side of the outer isolation pillar close to the display region, an isolation dam is provided between the inner isolation pillar and the outer isolation pillar, and an organic encapsulation frame covering the inner isolation pillar is provided between the isolation dam and the display region.

An embodiment of the present disclosure further provides a display device, including the display substrate provided by the embodiments of the present disclosure.

An embodiment of the present disclosure further provides a method for manufacturing a display substrate, the method includes:

providing a base substrate including a hole region, an isolation region surrounding the hole region, and a display region surrounding the isolation region; and forming at least one isolation pillar within the isolation region, where each isolation pillar is arranged at a perimeter surrounding the hole region; a light-emitting layer covering the isolation pillar is provided in the display region and the isolation region, and the isolation pillar separates the light-emitting layer at a location between the hole region and the display region; the at least one isolation pillar includes a plurality of layers of metal patterns and a plurality of insulating film layers, the plurality of layers of metal patterns is stacked sequentially on the base substrate, the plurality of insulating film layers covers the plurality of layers of metal patterns, and a shape of the plurality of insulating film layers conforms to a shape of the plurality of layers of the metal patterns.

Illustratively, the display region is provided with a thin film transistor, and the thin film transistor includes a gate electrode, a source electrode, and a drain electrode; and the forming at least one isolation pillar within the isolation region, specifically includes:

forming, on the base substrate, a first metal pattern, a second metal pattern and a third metal which are patterned, wherein at least one of the first metal pattern, the second metal pattern and the third metal pattern is formed in the same single patterning process as the gate electrode, and at least another one of the first metal pattern, the second metal pattern and the third metal pattern is formed in the same single patterning process as the source electrode and the drain electrode.

Embodiments of present disclosure have the following advantageous effects.

According to the display substrate, the method for manufacturing the same, and the display device provided by the embodiments of the present disclosure, when designing the frame encapsulation for the AA Hole provided in the display region, the isolation pillar is formed by forming multiples steps with the layers of metal patterns directly, and covering the layers of metal patterns with the insulating film layer with its shape conforming to the shape of the layers of metal patterns. In this way, a mask, which is used when forming a metal layer in the display region in the process of manufacturing the display substrate, can be reused directly to form a corresponding metal pattern in the isolation pillar. Compared with a conventional solution in which steps of the isolation pillar in the hole region are formed by etching the inorganic layer with the ion beam mask (EB mask) in the related art, according to embodiments of the present disclosure, the quantity of masks can be reduced, the process can be simplified and the manufacturing costs can be reduced.

DETAILED DESCRIPTION

To make objects, technical solutions and advantages of embodiments of the present disclosure more clearly, a detailed description of the embodiments of the present disclosure will be given hereinafter in conjunction with the appended drawings. It is to be understood that the described embodiments are some, rather than all, of embodiments of the present disclosure. Based on the embodiments described in the present disclosure, all other embodiments obtained by a person of ordinary skill in the art without inventive effort fall within the scope of the present disclosure.

Unless defined otherwise, technical or scientific terms used in this disclosure shall have the ordinary meaning as understood by one of ordinary skill in the art to which this disclosure belongs. The terms "first", "second", and the like as used herein do not denote any order, quantity, or importance, but rather are used to distinguish one element from another. Likewise, terms such as "a", "an", or "the" do not denote a limitation to the quantity, but rather denote the presence of at least one referenced item. The terms "include" or "comprise", and the like, means that an element or item preceding the word encompasses an element or item listed after the word and equivalents thereof, but does not exclude other elements or items. The terms "connect" or "couple" and the like are not limited to physical or mechanical connections, but may include electrical connections, whether direct or indirect. The terms "upper", "lower", "left", "right" and the like are used only to indicate relative positional relationships that may change accordingly when the absolute position of the object being described changes.

Before describing the display substrate, the method for manufacturing the same, and the display device provided by the embodiments of the present disclosure in detail, a description for related art is given as below.

Figure 1:
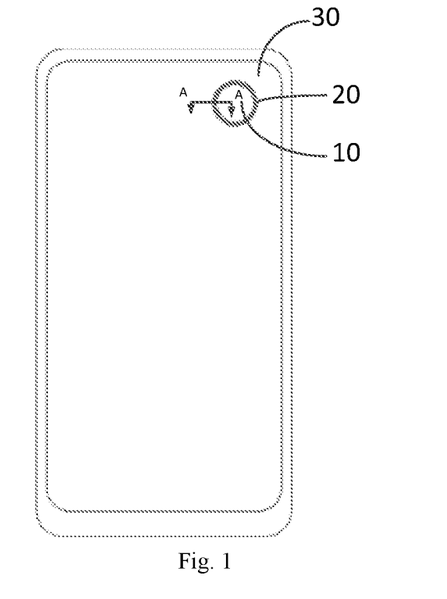
FIG. 1 is a diagram showing an overall structure of a display panel in the related art.
Figure 2:
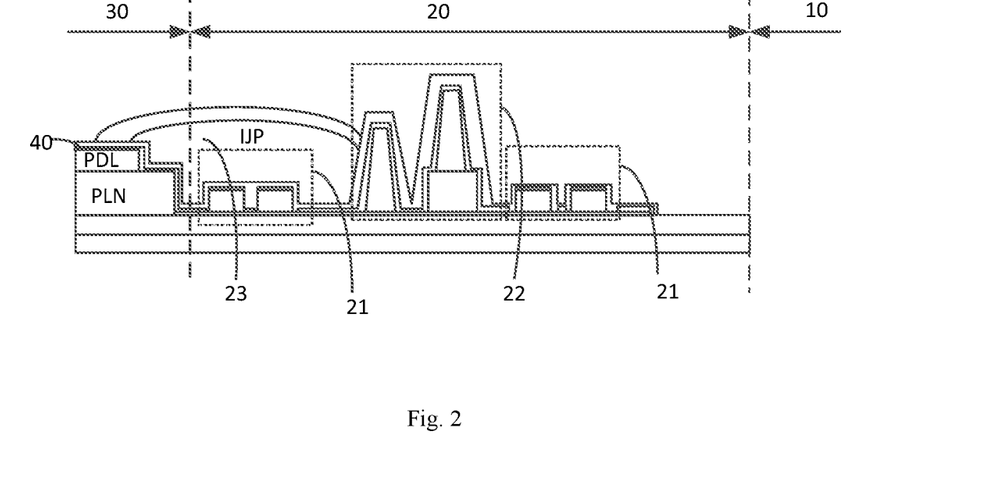
FIG. 2 is a schematic diagram showing a structure of an isolation region along A-A in FIG. 1.

In order to further increase the screen-to-body ratio, the AA Hole design i.e., the hole is provided in the screen, has been used in the screens of various display products. FIG. 1 is a schematic diagram showing a structure of an isolation region from an AA region to a hole region in an OLED display panel, and FIG. 2 is a cross-sectional view of a portion of the OLED display panel as shown in FIG. 1 along a cut line A-A indicating a structure from the AA region to the hole region. As shown in FIGS. 1 and 2, taking an OLED display panel as an example, a display screen includes a hole region (Hole area) 10, an isolation region 20 surrounding the hole region 10, and a display region (AA region) 30 surrounding the isolation region 20. An isolation frame structure needs to be provided in the isolation region 20 for separating the EL layer 40 in the AA region 10 from the EL layer 40 in the hole region 30, so as to prevent the water vapor and oxygen from entering into the AA region 10 along the EL layer, which may cause a display failure of the display panel. The isolation frame structure mainly includes: an isolation pillar 21, an isolation dam 22 and an organic encapsulation frame 23, in which the isolation pillar 21 is mainly used for blocking the corrosion of water and oxygen towards the AA region 10 at the cutting position of the hole region 30, and thus protecting the organic light-emitting material (Electro-Luminescence, EL layer) of the display region from being affected; and the isolation dam 22 is used for preventing an overflow of ink-jet printed (Ink Jet Printing, IJP) material for forming the organic encapsulation frame 23, so as to ensure the effectiveness of the organic encapsulation frame (TFE) 23, and to ensure the reliability of the product.

The applicant has found that in the AA Hole design in the related art, an ion beam mask (EB mask) should be used in forming the isolation pillar in the isolation region, which is formed by etching an inorganic layer away with the EB mask to form a segment difference of film layers. Compared with a traditional design in which a hole is disposed in a peripheral region of the screen, the above-mentioned solution needs to design the EB mask separately for etching the inorganic insulating layer (for example, an inter-level dielectric layer (ILD)) so as to form the isolation pillar. That is to say, the EB mask needs to be added to the normal process of manufacturing the display substrate, which must result in an increased cost and a complicated process.

In order to address the above-mentioned technical issue, embodiments of the present disclosure provide a display substrate, a method for manufacturing, and a display device, which can reduce the quantity of masks, reduce the cost and simplify the manufacturing process.

Figure 3:
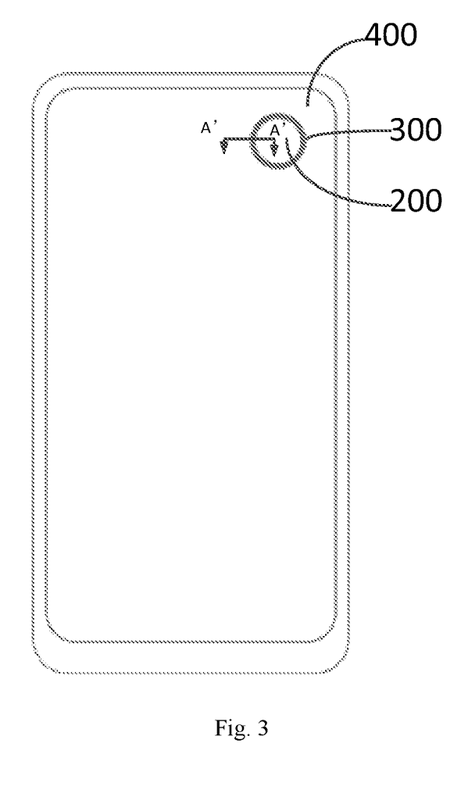
FIG. 3 is a schematic diagram showing a structure of a display substrate according to an embodiment of the present disclosure.
Figure 4:
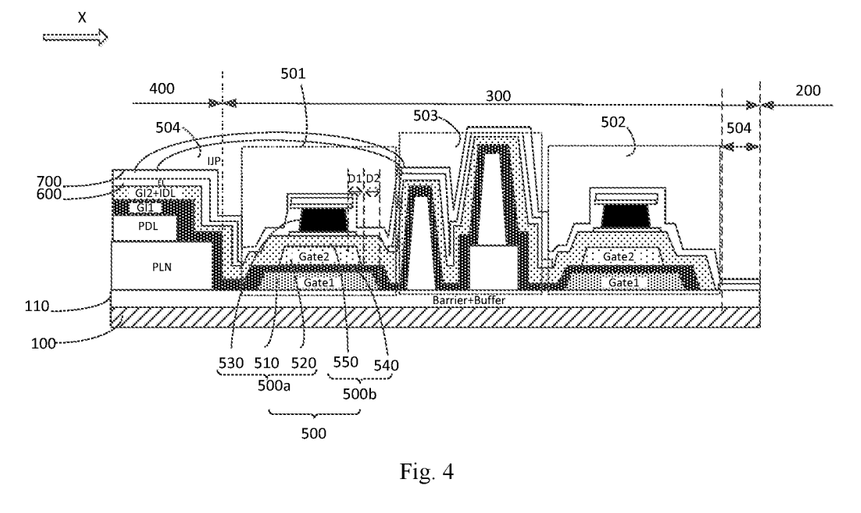
FIG. 4 is a schematic diagram showing a structure of an isolation region along A'-A' in FIG. 3.

FIG. 3 is a schematic diagram showing a structure of a display substrate according to an embodiment of the present disclosure; FIG. 4 is a schematic diagram showing a structure of an isolation region from an AA region to a hole region in the display substrate as shown in the figures, and in particular, FIG. 4 is a cross-sectional view of a portion of the display substrate as shown in FIG. 3 along the cutting line A'-A' indicating a structure from the AA region to the hole region.

As shown in FIGS. 3 and 4, an embodiment of the present disclosure provides a display substrate, including a base substrate 100, where the base substrate 100 includes a hole region 200, an isolation region 300 surrounding the hole region 200, and a display region 400 surrounding the isolation region 300, at least one isolation pillar 500 is provided within the isolation region 300, and the at least one isolation pillar 500 is arranged at a perimeter surrounding the hole region 200. A light-emitting layer 600, which may cover the isolation pillar 500, is provided in both the display region 400 and the isolation region 300, and the isolation pillar 500 makes the light-emitting layer 600 between the hole region 200 and the display region 400 to be disconnected. The isolation pillar 500 includes: a plurality of layers of metal patterns 500a stacked sequentially on the base substrate 100; and an insulating film layer 500b which is a stack of layers covering metal patterns 500a and has a shape conforming to said metal patterns 500a.

According to the display substrate provided by embodiments of the present disclosure, the isolation pillar 500 is formed as follows. Before evaporating the light-emitting layer 600 on the base substrate 100, an entire structure of the isolation pillar 500 is formed, so that when evaporating the light-emitting layer 600, the formed structure of the isolation pillar 500 can be used to separate the light-emitting layer 600 in the display region 400 from the hole region 200. The isolation pillar 500 is formed by laminating layers of metal patterns 500a, with each layer of metal pattern 500a being a pattern surrounding the whole perimeter of the hole region 200. In this way, side walls of the layers of metal patterns 500a form a segment difference between film layers for breaking the light-emitting layer 600. The insulating film layer 500b may be arranged between adjacent metal patterns 500a, and the insulating film layer 500b conformally covers the metal patterns 500a, such that the isolation pillar 500 is formed. The insulating film layer 500b includes multiple insulating layers, and each insulating layer is a continuous film layer without any disconnection. That is to say, the insulating film layer 500b conformally covers the metal steps, rather than being disconnected by etching, at the side walls of the metal steps.

In addition, in the display substrate provided by the embodiments of the present disclosure, a thin film transistor and metal layers such as an electrode layer may be provided in the display region 400. In this way, a mask, which is used when forming the metal layer in the display region in the process of manufacturing the display substrate, can be reused directly to form a corresponding metal pattern 500a in the isolation pillar 500. Compared with a conventional solution in which steps of the isolation pillar 500 in the hole region 200 are formed by etching the inorganic layer with the ion beam mask (EB mask) in the related art, according to embodiments of the present disclosure, the quantity of masks can be reduced, the manufacturing process can be simplified and the manufacturing costs can be reduced.

The display substrate provided by the embodiments of the present disclosure will be described in more detail below.

FIG. 4 is a schematic diagram showing a structure of a display substrate provided in some exemplary embodiments of the present disclosure, in which only a par, rather than all, of the structure of the display substrate is illustrated As shown in FIG. 4, in the display substrate, the base substrate 100 is further provided with an inorganic layer 110, in which the inorganic layer 110 includes a barrier layer (Barrier) and a buffer layer (Buffer) which are stacked sequentially in a direction away from the base substrate 100, and the base substrate 100 may be a glass substrate or a flexible substrate made of polyimide (PI), etc. In addition, some conventional structures are included in the display substrate, for example, a thin film transistor (TFT), a planarization layer (PLN), a pixel definition layer (PDL), a light-emitting layer 600 (EL layer), a first inorganic encapsulation layer, an organic layer and a second inorganic encapsulation layer, and any of the first inorganic encapsulation layer and the second inorganic encapsulation layer may be made of a material such as SiNx, SiCN, SiO2, etc. The first inorganic encapsulation layer and the second inorganic encapsulation layer may be formed by a chemical vapor deposition, a physical vapor deposition, an atomic layer deposition, or the like. The organic layer may include an acrylic-based polymer, a silicon-based polymer, etc. The organic layer may be formed at a side of the first inorganic encapsulation layer facing away from the base substrate 100 by means of an ink-jet printing, spraying, etc.

In some exemplary embodiments, as shown in FIG. 4, the display region 400 is provided with a thin film transistor (TFT), and the thin film transistor includes a gate electrode, a source electrode and a drain electrode; the plurality of layers of metal patterns 500a include: a first metal pattern 510, a second metal pattern 520 and a third metal pattern 530 which are stacked in the sequence listed from a side close to the base substrate 100 to a side away from the base substrate 100. At least one of the first metal pattern 510, the second metal pattern 520 and the third metal pattern 530 is arranged in the same layer and made of the same material as the gate electrode, and at least another one of the first metal pattern 510, the second metal pattern 520 and the third metal pattern 530 is arranged in the same layer and made of the same material as the source electrode and the drain electrode.

In the plurality of layers of metal patterns 500a in the isolation pillar 500, at least one metal pattern is arranged in the same layer and made of the same material as the gate electrode of the display region 400. In other words, the at least one metal pattern in the isolation pillar 500 is formed in the same single patterning process using the same one mask as the gate electrode in the display region 400. At least another one metal pattern 500a is formed in the same single patterning process using the same one mask as the source and drain metal patterns in the display region 400. In this way, the quantity of masks and the manufacturing cost can be reduced when compared with the method of etching the inorganic layer away to form the isolation pillar 500 in the related art.

It should be noted that, in practical application, the plurality of layers of metal patterns 500a in the isolation pillar 500 may also be formed by using other metal film layers. For example, taking an OLED display substrate as an example, the at least one metal pattern may also be formed using a cathode layer or an anode layer of the display region 400, etc.

In addition, it should be noted that, taking an OLED display substrate as an example, a plurality of TFTs is provided in the display region 400, and the TFTs may be any type of TFTs such as top-gate TFTs, bottom-gate TFTs or double-gate TFTs, and the type of TFT is not limited in the embodiments of the present disclosure. For example, the thin film transistor includes an active layer arranged at a side of the buffer layer facing away from the base substrate 100, a gate insulating layer (GI) arranged at a side of the active layer facing away from the base substrate 100, a gate electrode arranged at a side of the gate insulating layer facing away from the base substrate 100, an inter-level dielectric layer (ILD) arranged at the side of the gate insulating layer facing away from the base substrate 100, and a conductive layer arranged at a side of the inter-level dielectric layer facing away from the base substrate 100, in which the conductive layer includes a source electrode and a drain electrode of the thin film transistor, and the source electrode and the drain electrode are both electrically connected to the active layer.

In some exemplary embodiments, as shown in FIG. 4, the display region 400 includes a first gate metal pattern (GI1) and a second gate metal pattern (GI2) which are arranged in a stack, and at least one of the first gate metal pattern (GI1) and the second gate metal pattern (GI2) is the gate electrode. The first metal pattern 510 is arranged in the same layer and made of the same material as the first gate metal pattern (GI1), and the second metal pattern 520 is arranged in the same layer and made of the same material as the second gate metal pattern (GI2). The third metal pattern 530 is arranged in the same layer and made of the same material as the source electrode and the drain electrode.

Figure 5:
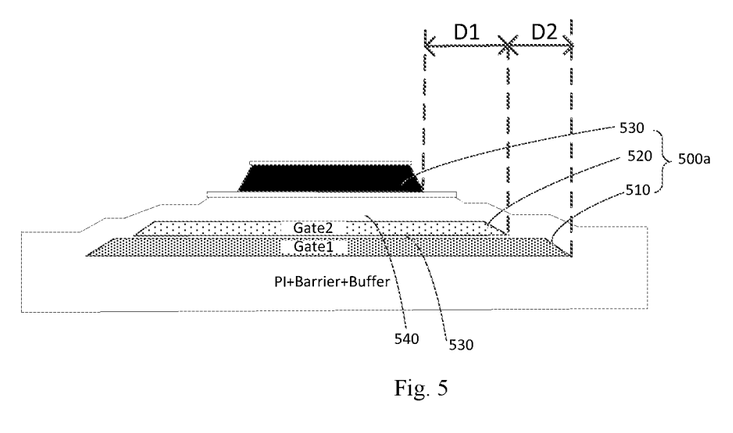
FIG. 5 is a schematic diagram showing a structure of an isolation pillar in a display substrate according to an embodiment of the present disclosure.

Furthermore, in some exemplary embodiments, as shown in FIG. 5, the insulating film layer 500b includes a first insulating layer 550 located between the first metal pattern 510 and the second metal pattern 520, and a second insulating layer 540 located between the second metal pattern 520 and the third metal pattern 530. At least one of the first insulating layer 550 and the second insulating layer 540 includes a gate insulating layer, and at least another one of the first insulating layer 550 and the second insulating layer 540 includes an inter-level dielectric layer and a buffer layer.

It should be noted that the foregoing is merely an example, and in other embodiments, the layers of metal patterns 500a and the insulating film layer 500b are not particularly limited as long as the structure of the isolation pillar 500 is formed in a manner in which the metal pattern 500a can be stacked to form a segment difference between film layers, and the insulating film layer 500b covers the metal pattern 500a with the shape of the insulating film layer 500b conforming to that of the metal pattern 500a. All such embodiments fall within the protection scope of the display substrate provided by the present disclosure.

Furthermore, in some exemplary embodiments of the present disclosure, as shown in the figure, the isolation pillar 500 includes a first side which is a side close to the display region 400, and a second side which is a side close to the hole region 200. In the isolation pillar 500, radial widths of layers of metal patterns 500a in a direction parallel to the base substrate 100 (an X direction in the figure) gradually reduce from the side close to the base substrate 100 to the side away from the base substrate 100. That is, as shown in FIG. 4, the radial widths of the layers of metal patterns 500a from the bottom to top, i.e. the radial widths of the first metal pattern 510 (Gate1), the second metal pattern 520 (Gate2) and the third metal pattern 530 (SD) gradually reduce, such that a plurality of steps is formed at the first side and the second side.

With the above solution, after each layer of metal pattern 500a in the isolation pillar 500 is formed, the insulating film layer 500b will cover a step of the metal pattern 500a. Specifically, when forming the isolation pillar 500 at the AA Hole, the first metal pattern 510 is firstly formed on the barrier layer (Barrier) and the buffer layer (Buffer) of the base substrate 100 to form a first step, and then the first insulating layer (for example, a first inorganic layer GI1) conformally covers (that is, having a shape matching with a shape of an element to be covered) the first metal pattern 510, such that the first insulating layer has a step-shaped transition at the first step formed by the first metal pattern 510. Thereafter, the second metal pattern 520 is formed on the step of the first metal pattern 510, and the radial width of the step formed by the first metal pattern 510 is larger than the radial width of the step formed by the second metal pattern 520, such that a second step is formed. Then, the second insulating layer (for example, the inter-level insulating layer and the buffer layer) conformally covers the second metal pattern 520, such that the second insulating layer has step-shaped transitions at the first step formed by the first metal pattern 510 and at the second step formed by the second metal pattern 520, respectively. In other words, there may be two step-shaped transitions for the second insulating layer. Likewise, other layers in the metal pattern 500a and other insulating layers are successively formed, thereby forming a plurality of steps at the first side and the second side of the isolation pillar. If the radial widths of the layers in the metal pattern 500a in the isolation pillar 500 are equal to each other, the layers in the metal pattern 500a may form a great segment difference of film layers at the first side and the second side of the isolation pillar 500, and there may be a risk that the insulating layer(s) breaks and loses an ability of blocking the water and oxygen from entering into the AA region. The above design provided by the embodiments of the disclosure can mitigate such a risk.

In some exemplary embodiments, as shown in FIG. 4, at the first side, the difference D1 between the radial widths of the metal steps formed by two adjacent metal patterns 500a in the direction parallel to the base substrate 100 is greater than or equal to 1 micron; and at the second side, the difference D2 of the radial widths of the metal steps formed by two adjacent metal patterns 500a in the direction parallel to the base substrate 100 is greater than or equal to 1 micron.

With the above solution, at the first side (namely, the left side in the figure) of the isolation pillar 500, the distance between the step of the first metal pattern 510 and the step of the second metal pattern 520, namely, the difference D1 between the radial widths of the metal steps formed by two adjacent the metal patterns 500a in the direction parallel to the base substrate 100, is greater than or equal to 1 micron. Similarly, the distance D2 between the step of the second metal pattern 520 and the step of the third metal pattern 530 is greater than or equal to 1 micron. According to verification by practical processes, if this difference is less than 1 micron, there is a risk that the isolation pillar 500 might be broken, and such a design can also enable the structure of the isolation pillar 500 to have substantially the same structure as the design in which the isolation pillar 500 is obtained by etching an inorganic layer with an EB Mask in the related art. Similarly, at the second side of the isolation pillar 500, the difference between the radial widths of the metal steps formed by two adjacent metal patterns 500a in the direction parallel to the base substrate 100 is greater than or equal to 1 micron.

Furthermore, it should be noted that, as shown in FIG. 4, in some exemplary embodiments, the cross-section shape of each metal pattern 500a in the direction perpendicular to the base substrate 100 is trapezoidal, and in other embodiments, the cross-section shape of each metal pattern 500a may be rectangular or other shapes, the present disclosure is not limited thereto.

The insulating film layer conformally covers on the metal pattern, and may have a gradient angle in a range from 30 degrees to 60 degrees, so as to facilitate the breaking of the EL light-emitting layer, while ensuring that the encapsulation layer TFE 700 is not broken, thereby facilitating the encapsulation.

Furthermore, it is to be noted that in the above-described embodiments, in the isolation pillar 500, the radial widths of the layers of metal patterns 500a in the direction parallel to the base substrate 100 gradually reduce from the side close to the base substrate 100 to the side away from the base substrate 100, but in other embodiments, the relationship between the radial widths of the plurality of layers of metal patterns 500a is not limited thereto and will not be described again.

Furthermore, in some exemplary embodiments, as shown in FIGS. 3 and 4, at least two isolation pillars 500 are provided in the isolation region 300, the at least two isolation pillars 500 include an inner isolation pillar 501 and an outer isolation pillar 502, the inner isolation pillar 501 is located at a side of the outer isolation pillar 502 close to the display region 400, an isolation dam 503 is provided between the inner isolation pillar 501 and the outer isolation pillar 502, and an organic encapsulation frame 504 covering the inner isolation pillar 501 is provided between the isolation dam 503 and the display region 400.

In this embodiment, two or more isolation pillars 500 may be provided, and the isolation pillars 500 are spaced apart, a recess is formed between two adjacent isolation pillars 500 so as to break the light-emitting layer 600. The effectiveness of blocking the intrusion channel of water and oxygen can be increased with an increase in the quantity of isolation pillars 500. It should be noted that the increase in the quantity of the isolation pillars 500 may increase the difficulty of the process of manufacturing the display panel and increase the production cost, and therefore, in practical applications, the specific quantity of the isolation pillars 500 may be selected according to actual needs, and the specific quantity of the isolation pillars 500 is not limited.

In addition, when the quantity of the isolation pillars 500 is two or more, the distance between two adjacent isolation pillars 500 in the direction parallel to the base substrate 100 ranges from 80 μm to 130 μm, in which the distance between two adjacent isolation pillars 500 in the direction parallel to the base substrate 100 specifically refers to the closest distance between the third metal patterns 530 in the two adjacent isolation pillars 500.

For example, in some embodiments, only two isolation pillars are provided (as shown in FIG. 4), in which one isolation pillar is the inner isolation pillar 501 and the other isolation pillar is the outer isolation pillar 502, the isolation dam 503 is provided between the inner isolation pillar 501 and the outer isolation pillar 502, and an organic encapsulation frame 504 is formed between the isolation dam 503 and the display region 400. In the embodiment shown in FIG. 4, the spacing between the inner isolation pillar and the outer isolation pillar in the direction parallel to the base substrate 100 (the X direction in FIG. 4) is preferably 127±0.5 μm. In some specific embodiments of the present disclosure, two isolation pillars 500 are arranged on the base substrate 100 and spaced part from each other, the isolation pillar 500 at the side close to the display region 400 is the inner isolation pillar 501, and the isolation pillar 500 at the side close to the hole region 200 is the outer isolation pillar 502. By arranging the two isolation pillars 500, the effectiveness of blocking the intrusion channel of water and oxygen by the isolation pillar 500 can be improved, while a large production cost due to large quantity of the isolation pillars 500 can be avoided. In some other embodiments, the isolation region is provided with only one isolation pillar, the isolation dam is provided between the isolation pillar and the hole region, and the organic encapsulation frame is formed between the isolation dam and the display region.

In some other embodiments, two or more isolation pillars are provided in the isolation region, an isolation dam may be provided between every two isolation pillars, in which an organic encapsulation frame is formed between one of isolation dams and the display region, for example, the organic encapsulation frame is formed between the display region and the one isolation dam which is located between two isolation pillars closest to the display region. Alternatively, an organic encapsulation frame is formed between the display region and the one isolation dam which is located between two isolation pillars closest to the hole region. Alternatively, an organic encapsulation frame is formed between the display region and the one isolation dam which is located between two isolation pillars in the middle of the two or more isolation pillars. The spacing between two adjacent isolation pillars 500 in the direction parallel to the base substrate 100 ranges from 80 μm to 130 μm.

In some other embodiments, two or more isolation pillars are provided in the isolation region, only one isolation dam is arranged between two isolation pillars which are farthest away from the display region, and an organic encapsulation frame is formed between the isolation dam and the display region. Alternatively, only one isolation dam is provided between two isolation pillars which are farthest away from the hole region, and an organic encapsulation frame is formed between the isolation dam and the display region. Alternatively, only one isolation dam is provided between two isolation pillars in the middle of the two or more isolation pillars, and an organic encapsulation frame is formed between the isolation dam and the display region.

The spacing between two adjacent isolation pillars 500 in the direction parallel to the base substrate 100 ranges from 80 μm to 130 μm.

Furthermore, in these embodiments, in the isolation region 300, the isolation dam 503 (Dam) is provided in the spacing between two adjacent isolation pillars 500, and the inner isolation pillar 501 and the outer isolation pillar 502 are mainly for preventing the water and oxygen from entering into the AA region at the cutting position of the hole region 200, so as to protect the organic light-emitting material (Electro-Luminescence, EL layer) of the display region 400 from being affected. The organic encapsulation frame 504 covering the inner isolation pillar 501 is provided between the isolation dam 503 and the display region 400, and the organic encapsulation frame 504 may be an encapsulation structure formed by an ink-jet printed material, and the isolation dam 503 is used for preventing an overflow of the ink-jet printed (IJP) material, so as to ensure the effectiveness of TFE outside the Dam, thereby ensuring the product reliability.

In addition, as shown in FIG. 4, in the display substrate provided by the embodiments of the present disclosure, a cutting heat-affected region (Margin) 504 is further provided in the isolation region, and the cutting heat-affected region 504 is for separating various film layers in the isolation region from the hole region, so as to prevent the film layers in the isolation region from being affected when a laser cutting is performed in the hole region. The quantity of isolation pillars is plural, and the isolation pillars extend to the vicinity of the cutting heat-affected region or into the cutting heat-affected region.

Furthermore, in a display substrate provided by an exemplary embodiment of the present disclosure, the thicknesses of the film layers in the isolation region may be as follows.

The thickness of the film layer for the first metal pattern (Gate1) is in a range of 2110 Å (Angstrom) to 2890 Å.

The thickness of the film layer for the second metal pattern (Gate2) is in the range of 2110 Å to 2890 Å;

The third metal pattern (SD) has a laminated structure, including a first metal portion, a second metal portion and a third metal portion which are sequentially stacked from a side away from the base substrate to a side close to the base substrate (namely, from top to bottom), in which the material of the first metal portion and the third metal portion may be Ti (Titanium), the material of the second metal portion may be Al (Aluminum). The thickness of the film layer for the first metal portion is in a range of 500 Å to 600 Å. The thickness of the film layer for the second metal portion is in a range of 4900 Å to 6100 Å. The thickness of the film layer for the third metal portion is in a range of 450 Å to 550 Å. The thickness of the first insulating layer (GI1) is in a range of 1108 Å to 1291 Å.

The thickness of the buffer layer in the second insulating layer (GI2) is in a range of 1202 Å to 1398 Å.

The inter-level dielectric layer (IDL) in the second insulating layer may include a silicon oxide layer and a silicon nitride layer, in which the thickness of the silicon nitride layer is in a range of 2793 Å to 3217 Å, and the thickness of the silicon oxide layer is in a range of 1793 Å to 2207 Å.

For example, in some embodiments, the thickness of the film layer for the first metal pattern (Gate1) is 2890 Å; the thickness of the film layer for the second metal pattern (Gate2) is 2890 Å; and the third metal pattern (SD) has a laminated structure, including a first metal portion, a second metal portion and a third metal portion which are sequentially stacked from a side away from the base substrate to a side close to the base substrate (namely, from top to bottom), in which the material of the first metal portion and the third metal portion may be Ti (Titanium), the material of the second metal portion may be Al (Aluminum), and the thickness of the film layer for the first metal portion is 500 Å; the thickness of the film layer for the second metal portion is 4900 Å, and the thickness of the film layer for the third metal portion is 450 Å; the thickness of the first insulating layer (GI1) is 1108 Å; the thickness of the buffer layer in the second insulating layer (GI2) is 1202 Å; and the inter-level dielectric layer (IDL) in the second insulating layer may include a silicon oxide layer and a silicon nitride layer, in which the thickness of the silicon nitride layer is 2793 Å, and the thickness of the silicon oxide layer is 1793 Å.

For another example, in some embodiments, the thickness of the film layer for the first metal pattern (Gate1) is 2110 Å; the thickness of the film layer for the second metal pattern (Gate2) is 2110 Å; and the third metal pattern (SD) has a laminated structure, including a first metal portion, a second metal portion and a third metal portion which are sequentially stacked from a side away from the base substrate to a side close to the base substrate, in which the material of the first metal portion and the third metal portion may be Ti (Titanium), the material of the second metal portion may be Al (Aluminum), and the thickness of the film layer for the first metal portion is 600 Å; the thickness of the film layer for the second metal portion is 6100 Å, and the thickness of the film layer for the third metal portion is 550 Å; the thickness of the first insulating layer (GI1) is 1291 Å; the thickness of the buffer layer in the second insulating layer (GI2) is 1398 Å; and the inter-level dielectric layer (IDL) in the second insulating layer may include a silicon oxide layer and a silicon nitride layer, in which the thickness of the silicon nitride layer is 3217 Å, and the thickness of the silicon oxide layer is 2207 Å.

For still another example, in some embodiments, the thickness of the film layer for the first metal pattern (Gate1) is 2500 Å; the thickness of the film layer for the second metal pattern (Gate2) is 2500 Å; and the third metal pattern (SD) has a stacked structure, including a first metal portion, a second metal portion and a third metal portion which are sequentially stacked from a side away from the base substrate to a side close to the base substrate, in which the material of the first metal portion and the third metal portion may be Ti (Titanium), the material of the second metal portion may be Al (Aluminum), and the thickness of the film layer for the first metal portion is 550 Å; the thickness of the film layer for the second metal portion is 5500 Å, and the thickness of the film layer for the third metal portion is 500 Å; the thickness of the first insulating layer (GI1) is 1200 Å; the thickness of the buffer layer in the second insulating layer (GI2) is 1300 Å; and the inter-level dielectric layer (IDL) in the second insulating layer may include a silicon oxide layer and a silicon nitride layer, in which the thickness of the silicon nitride layer is 3000 Å, and the thickness of the silicon oxide layer is 2000 Å.

It should be understood that a suitable thickness for each film layer may be selected according to actual needs and will not be enumerated herein.

Furthermore, in some embodiments of the present disclosure, a ratio of the thickness of the film layer for the first metal pattern to that for the second metal pattern ranges from 0.73 to 1.37; a ratio of the thickness of the film layer for the first metal pattern to that for the first metal portion in the third metal pattern ranges from 3.51 to 5.78; a ratio of the thickness of the film layer for the first metal pattern to that for the second metal portion in the third metal pattern ranges from 0.35 to 0.59; a ratio of the thickness of the film layer for the first metal pattern to that for the third metal portion in the third metal pattern ranges from 2.01 to 2.87; a ratio of the thickness of the film layer for the first metal pattern to the thickness of the first insulating layer ranges from 1.63 to 2.61; a ratio of the thickness of first insulating layer to that of the buffer layer in the second insulating layer ranges from 0.36 to 1.07; a ratio of the thickness of the buffer layer to that of the silicon nitride layer in the inter-level dielectric layer included in the second insulating layer ranges from 0.37 to 1.11, and a ratio of the thickness of the buffer layer to that of the silicon oxide layer ranges from 0.50 to 1.73.

For example, in some embodiments, a ratio of the thickness of the film layer for the first metal pattern to that for the second metal pattern is 1.37; a ratio of the thickness of the film layer for the first metal pattern to that for the first metal portion in the third metal pattern is 3.51; a ratio of the thickness of the film layer for the first metal pattern to that for the second metal portion in the third metal pattern is 0.35; a ratio of the thickness of the film layer for the first metal pattern to that for the third metal portion in the third metal pattern is 2.01; a ratio of the thickness of the film layer for the first metal pattern to the thickness of the first insulating layer is 1.63; a ratio of the thickness of the first insulating layer to that of the buffer layer in the second insulating layer is 0.36; a ratio of the thickness of the buffer layer to that of the silicon nitride layer in the inter-level dielectric layer included in the second insulating layer is 0.37, and a ratio of the thickness of the buffer layer to that of the silicon oxide layer is 0.50.

For example, in some embodiments, a ratio of the thickness of the film layer for the first metal pattern to that for the second metal pattern is 0.73; a ratio of the thickness of the film layer for the first metal pattern to that for the first metal portion in the third metal pattern is 5.78; a ratio of the thickness of the film layer for the first metal pattern to that for the second metal portion in the third metal pattern is 0.59; a ratio of the thickness of the film layer for the first metal pattern to that for the third metal portion in the third metal pattern is 2.87; a ratio of the thickness of the film layer for the first metal pattern to the thickness of the first insulating layer is 2.61; a ratio of the thickness of the first insulating layer to that of the buffer layer in the second insulating layer is 1.07; a ratio of the thickness of the buffer layer to that of the silicon nitride layer in the inter-level dielectric layer included in the second insulating layer is 1.11, and a ratio of the thickness of the buffer layer to that of the silicon oxide layer is 1.73.

In some embodiments, a ratio of the thickness of the film layer for the first metal pattern to that for the second metal pattern is 1; a ratio of the thickness of the film layer for the first metal pattern to that for the first metal portion in the third metal pattern is 4.55; a ratio of the thickness of the film layer for the first metal pattern to that for the second metal portion in the third metal pattern is 0.45; a ratio of the thickness of the film layer for the first metal pattern to that for the third metal portion in the third metal pattern is 5; a ratio of the thickness of the film layer for the first metal pattern to the thickness of the first insulating layer is 2.1; a ratio of the thickness of the first insulating layer to the thickness of the buffer layer in the second insulating layer is 0.92; a ratio of the thickness of the buffer layer to the thickness of the silicon nitride layer in the inter-level dielectric layer included in the second insulating layer is 0.43, and a ratio of the thickness of the buffer layer to that of the silicon oxide layer is 0.65.

It should be understood that a suitable ratio for the thicknesses of various film layers may be selected according to actual needs, which will not be enumerated herein.

In addition, a product cross-sectional verification is performed on the display panel provided by the embodiments of the present disclosure, for example, a focused ion beam (FIB) process may be adopted for the verification. It can be seen from the FIB result that: in the display substrate provided by the embodiments of the present disclosure, there is no breakage for the isolation pillar 500, and there is no risk in breakage for the isolation pillar 500.

Furthermore, an embodiment of the present disclosure further provides a display device, including the display substrate provided by the embodiments of the present disclosure.

The display device may be a liquid crystal television, a liquid crystal display, a digital photo frame, a mobile phone, a tablet computer, or any product or component with a display function, in which the display device further includes a flexible circuit board, a printed circuit board and a back plate.

In the display device, one or more of the following items may be provided under the hole region 200: a camera, a sensor, a physical key button and a frame of the display screen, etc. Generally, during the process of manufacturing the display device, a hole region, i.e., a hole region 200 inside a display region 400, may be reserved for the hardware inside the display device including, e.g., the above-mentioned camera, sensor, physical key button, etc.

Furthermore, an embodiment of the present disclosure further provides a method for manufacturing a display substrate, the method including the following steps.

At step S01, a base substrate 100 is provided, the base substrate 100 includes a hole region 200, an isolation region 300 surrounding the hole region 200, and a display region 400 surrounding the isolation region 300.

at step S02, at least one isolation pillar 500 is formed within the isolation region 300, and each isolation pillar 500 is arranged at a perimeter surrounding the hole region 200; where a light-emitting layer 600 covering the isolation pillar 500 is provided in the display region 400 and the isolation region 300, and the isolation pillar 500 separates the light-emitting layer 600 which is located between the hole region 200 and the display region 400. The isolation pillar 500 includes: a plurality of layers of metal patterns 500*a* stacked sequentially on the base substrate 100; and a plurality of insulating film layers 500*b* covering the plurality of layers of metal patterns 500*a*, a shape of the plurality of insulating film layers 500*b* conforms to a shape of the plurality of layers of metal patterns 500*a*.

Illustratively, the display region 400 is provided with a thin film transistor (TFT), and the thin film transistor includes a gate electrode, a source electrode, and a drain electrode; and the step S02 specifically includes:

forming, on the base substrate 100, a first metal pattern 510, a second metal pattern 520 and a third metal which are patterned, where at least one of the first metal pattern 510, the second metal pattern 520 and the third metal pattern 530 is formed in the same patterning process with the gate electrode, and at least another one of the first metal pattern 510, the second metal pattern 520 and the third metal pattern 530 is formed in the same patterning process with the source electrode and the drain electrode.

It should be noted that in the above-described solution, before forming, on the base substrate 100, the first metal pattern 510, the second metal pattern 520 and the third metal pattern 530, the method may further include: forming an inorganic layer on the base substrate 100, where the inorganic layer includes, for example, a barrier layer (Barrier), a buffer layer (Buffer), and the like.

Furthermore, it should be noted that the method further includes steps of forming some conventional structures in the display substrate, for example, a thin film transistor (TFT), a planarization layer (PLN), a pixel definition layer (PDL), a light-emitting layer 600 (an EL layer), a first inorganic encapsulation layer, an organic layer and a second inorganic encapsulation layer, and any of the first inorganic encapsulation layer and the second inorganic encapsulation layer may be made of a material such as SiNx, SiCN, SiO2, etc. The first inorganic encapsulation layer and the second inorganic encapsulation layer may be formed by a chemical vapor deposition, a physical vapor deposition, or an atomic layer deposition, and the like. The organic layer may include an acrylic-based polymer, a silicon-based polymer, etc. The organic layer may be formed at a side of the first inorganic encapsulation layer facing away from the base substrate 100 by means of an ink-jet printing, a spraying, etc. The description thereof is omitted herein.

Illustratively, the display region 400 includes a first gate metal pattern (GI1) and a second gate metal pattern (GI2) which are arranged in different layers, and at least one of the first gate metal pattern (GI1) and the second gate metal pattern (GI2) is the gate electrode; and the step S01 specifically includes the following steps.

At step S011, the first metal pattern 510 and the first gate metal pattern (GI1) are formed in the same single patterning process.

Specifically, firstly, a first gate metal layer is deposited on the base substrate 100, in which the first gate metal layer may be a gate metal layer with a thickness of about 500 Å to 4000 Å deposited on the base substrate 100 by means of a sputtering or a thermal evaporation. The first gate metal layer may be a metal such as Cu, Al, Ag, Mo, Cr, Nd, Ni, Mn, Ti, Ta, W, etc., or an alloy formed by any of these metals, and the first gate metal layer may be a single-layer structure, or a multi-layer structure such as Cu\Mo, Ti\Cu\Ti, Mo\Al\Mo, etc. Then, a layer of photoresist is coated on the first gate metal layer, and an exposure is performed on the photoresist with a mask, so that a photoresist-unreserved region and a photoresist-reserved region is formed in the layer of the photoresist, in which the photoresist-reserved region corresponds to a region where patterns such as the first gate metal pattern (GI1) (for example, a gate line and a gate electrode, etc.) of the display region 400 and the first metal pattern 510 of the isolation region 300 are located, and the photoresist-unreserved region corresponds to a region other than the above-mentioned patterns. A developing treatment is performed, and the photoresist in the photoresist-unreserved region is completely removed, while the thickness of the photoresist in the photoresist-reserved region remains unchanged. The gate metal film in the photoresist-unreserved region is completely etched away by an etching process, and the remaining photoresist is peeled off, to form the first gate metal pattern (GI1) of the display region 400 and the first metal pattern 510 of the isolation region 300.

At step S012, a first insulating layer is formed on the first metal pattern 510.

Specifically, the first insulating layer be formed by means of a plasma enhanced chemical vapor deposition (PECVD) method, such that a gate insulating layer with a thickness of 500-5000 Å is deposited on the base substrate 100, and the gate insulating layer may be selected from an oxide, a nitride or an oxynitride, with the corresponding reaction gas being SiH4, NH3, N2 or SiH2Cl2, NH3, N2.

At step S013, the second metal pattern 520 and the second gate metal pattern (GI2) are formed in the same single patterning process.

Specifically, firstly, a second gate metal layer is deposited on the base substrate 100, where the second gate metal layer may be a gate metal layer with a thickness of about 500 Å to 4000 Å deposited on the base substrate 100 by means of a sputtering or a thermal evaporation method, the second gate metal layer may be a metal such as Cu, Al, Ag, Mo, Cr, Nd, Ni, Mn, Ti, Ta, W, etc., or an alloy formed by any of these metals. The second gate metal layer may be a single-layer structure, or a multi-layer structure such as Cu\Mo, Ti\Cu\Ti, Mo\Al\Mo, and the like. Then, a layer of photoresist is coated on the second gate metal layer, and an exposure is performed on the photoresist with a mask, so that a photoresist-unreserved region and a photoresist-reserved region are formed in the layer of photoresist, in which the photoresist-reserved region corresponds to a region where patterns such as the second gate metal pattern (GI2) (for example, a gate line and a gate electrode, etc.) of the display region 400 and the second metal pattern 520 of the isolation region 300 are located, and the photoresist-unreserved region corresponds to a region other than the above-mentioned patterns. A developing treatment is performed, and the photoresist in the photoresist-unreserved region is completely removed, while the thickness of the photoresist in the photoresist-reserved region remains unchanged. The gate metal film in the photoresist-unreserved region is completely etched away by an etching process, and the remaining photoresist is peeled off, to form the second gate metal pattern (GI2) of the display region 400 and the second metal pattern 520 of the isolation region 300.

At step 5014, a second insulating layer is formed on the first metal pattern 510.

Specifically, the second insulating layer may be an inorganic film layer including an inter-level dielectric layer and a buffer layer, etc. The inter-level dielectric layer may be deposited by means of a magnetron sputtering, a thermal evaporation, a PECVD or other film-forming methods, to form a layer with a thickness of 2000 Å to 1000 Å The inter-level dielectric layer may be selected from an oxide, a nitride or an oxynitride, and in particular, the material of the inter-level dielectric layer may be SiNx, SiOx or Si(ON)x. The inter-level dielectric layer may be a single-layer structure or a double-layer structure formed by the silicon nitride and silicon oxide. The reaction gas corresponding to the silicon oxide may be SiH4 or N2O, and the gas corresponding to the nitride or oxynitride may be SiH4, NH3, N2 or SiH2Cl2, NH3, N2.

The buffer layer be formed by using a plasma enhanced chemical vapor deposition (PECVD) method to deposit an inorganic layer with a thickness of 500 Å to 5000 Å on the base substrate 100, and the inorganic layer may be selected from an oxide, a nitride or an oxynitride, with the corresponding reaction gas being SiH4, NH3, N2 or SiH2Cl2, NH3, N2.

At step 5015, the third metal pattern 530 and the source electrode and the drain electrode are formed in the same single patterning process.

Specifically, the step 5015 includes as follows.

Firstly, a source-drain metal layer is deposited on the base substrate 100, in which the source-drain metal layer may be a metal layer with a thickness of about 500 Å to 4000 Å deposited on the base substrate 100 by means of a sputtering or thermal evaporation method, the source-drain metal layer may be a metal such as Cu, Al, Ag, Mo, Cr, Nd, Ni, Mn, Ti, Ta, W, etc., or an alloy formed by any of these metals, and the source-drain metal layer may be a single-layer structure, or a multi-layer structure such as Cu\Mo, Ti\Cu\Ti, Mo\Al\Mo, Ti\Al\Ti and the like. Then, a layer of photoresist is coated on the source-drain metal layer, and a exposure is performed on the photoresist with a mask, so that a photoresist-unreserved region and a photoresist-reserved region are formed in the layer of photoresist, in which the photoresist-reserved region corresponds to a region where patterns such as the source-drain metal pattern 500a (for example, a gate line and a gate electrode, etc.) of the display region 400 and the third metal pattern 530 of the isolation region 300 are located, and the photoresist-unreserved region corresponds to a region other than the above-mentioned patterns. A developing treatment is performed, and the photoresist in the photoresist-unreserved region is completely removed, while the thickness of the photoresist in the photoresist-reserved region remains unchanged. The gate metal film in the photoresist-unreserved region is completely etched away by an etching process, and the remaining photoresist is peeled off, to form the source-drain metal pattern 500a of the display region 400 and the third metal pattern 530 of the isolation region 300.

It should be noted that although the steps of the methods of the present disclosure are depicted in the drawings in a particular order, this does not require or imply that the steps be performed in the particular order, or that all illustrated steps needs to be performed, to achieve the desired results. Additionally or alternatively, certain steps may be omitted, multiple steps combined into one step, and/or one step decomposed into multiple steps, etc.

The following points need to be explained:

(1) The drawings for embodiments of the present disclosure only relate to the structures to which the embodiments of the present disclosure relate, and other structures may refer to general designs.

(2) In the drawings for describing embodiments of the present disclosure, the thickness of layers or regions is exaggerated or reduced for clarity, i.e. the drawings are not drawn to scale. It will be understood that when an element such as a layer, film, region or substrate is referred to as being "on" or "under" another element, it can be "directly on" or "directly under" the other element or intervening elements may be present.

(3) Embodiments of the present disclosure and features of the embodiments may be combined with each other to obtain new embodiments in a case that there is no conflict.

The foregoing describes only specific embodiments of the present disclosure, but the protection scope of the disclosure is not limited thereto. The protection scope of the disclosure is set forth in the appended claims.

What is claimed is:

1. A display substrate, comprising a base substrate, wherein the base substrate comprises a hole region, an isolation region surrounding the hole region, and a display region surrounding the isolation region, at least one isolation pillar is provided within the isolation region, and each isolation pillar is arranged at a perimeter surrounding the hole region; a light-emitting layer covering the at least one isolation pillar is provided in the display region and the isolation region, and the at least one isolation pillar separates the light-emitting layer at a location between the hole region and the display region; and wherein the isolation pillar comprises a plurality of layers of metal patterns stacked sequentially on the base substrate, and an insulating film layer; the insulating film layer includes a stack of layers covering the plurality of layers of the metal patterns, and a shape of the stack of layers conforms to a shape of the plurality of layers of the metal patterns;

the plurality of layers of metal patterns comprise: a first metal pattern, a second metal pattern and a third metal pattern which are stacked sequentially from a side close to the base substrate to a side away from the base substrate;

the display region is provided with a thin film transistor, and the thin film transistor comprises a gate electrode, a source electrode and a drain electrode; and at least one of the first metal pattern, the second metal pattern and the third metal pattern is arranged in the same layer and made of the same material as the gate electrode, and at least another one of the first metal pattern, the second metal pattern and the third metal pattern is arranged in the same layer and made of the same material as the source electrode and the drain electrode;

the at least one isolation pillar comprises a first side and a second side, the first side is a side close to the display region, and the second side is a side close to the hole region;

the third metal pattern is a multi-layer structure; and in the at least one isolation pillar, a radial width of the first metal pattern in a direction parallel to the base substrate, a radial width of the second metal pattern in the direction parallel to the base substrate, and a radial width of the third metal pattern in the direction parallel to the base substrate gradually reduce, such that a plurality of steps is formed at the first side and the second side.

2. The display substrate according to claim 1, wherein, the display region comprises a first gate metal pattern and a second gate metal pattern which are arranged in a stack, and at least one of the first gate metal pattern and the second gate metal pattern is the gate electrode;

the first metal pattern is arranged in the same layer and made of the same material as the first gate metal pattern;

the second metal pattern is arranged in the same layer and made of the same material as the second gate metal pattern; and the third metal pattern is arranged in the same layer and made of the same material as the source electrode and the drain electrode.

3. The display substrate according to claim 1, wherein, the insulating film layer comprises a first insulating layer and a second insulating layer, the first insulating layer is located between the first metal pattern and the second metal pattern, and the second insulating layer is located between the second metal pattern and the third metal pattern; wherein at least one of the first insulating layer and the second insulating layer comprises a gate insulating layer, and at least another one of the first insulating layer and the second insulating layer comprises an inter-level dielectric layer and a buffer layer.

4. The display substrate according to claim 1, wherein, at the first side, a difference between radial widths of metal steps formed by two adjacent metal patterns in the direction parallel to the base substrate is greater than or equal to 1 micron; and at the second side, a difference between radial widths of metal steps formed by two adjacent metal patterns in the direction parallel to the base substrate is greater than or equal to 1 micron.

5. The display substrate according to claim 4, wherein a thickness of a film layer for the first metal pattern is in a range of 2110 Angstroms to 2890 Angstroms; and
a thickness of a film layer for the second metal pattern is in a range of 2110 Angstroms to 2890 Angstroms.

6. The display substrate according to claim 5, wherein the insulating film layer comprises a first insulating layer and a second insulating layer, the first insulating layer is located between the first metal pattern and the second metal pattern, and the second insulating layer is located between the second metal pattern and the third metal pattern; wherein at least one of the first insulating layer and the second insulating layer comprises a gate insulating layer, and at least another one of the first insulating layer and the second insulating layer comprises an inter-level dielectric layer and a buffer layer;
the inter-level dielectric layer in the second insulating layer comprises a silicon oxide layer and a silicon nitride layer, a thickness of the silicon nitride layer is in a range of 2793 Angstroms to 3217 Angstroms, and a thickness of the silicon oxide layer is in a range of 1793 Angstroms to 2207 Angstroms; and
a ratio of the thickness of the film layer for the first metal pattern to the thickness of the film layer for the second metal pattern ranges from 0.73 to 1.37; a ratio of the thickness of the film layer for the first metal pattern to a thickness of a film layer for a first metal portion in the third metal pattern ranges from 3.51 to 5.78; a ratio of the thickness of the film layer for the first metal pattern to a thickness of a film layer for a second metal portion in the third metal pattern ranges from 0.35 to 0.59; a ratio of the thickness of the film layer for the first metal pattern to a thickness of a film layer for a third metal portion in the third metal pattern ranges from 2.01 to 2.87; a ratio of the thickness of the film layer for the first metal pattern to a thickness of the first insulating layer ranges from 1.63 to 2.61; a ratio of the thickness of first insulating layer to a thickness of the buffer layer in the second insulating layer ranges from 0.36 to 1.07; a ratio of the thickness of the buffer layer to the thickness of the silicon nitride layer in the inter-level dielectric layer included in the second insulating layer ranges from 0.37 to 1.11, and a ratio of the thickness of the buffer layer to the thickness of the silicon oxide layer ranges from 0.50 to 1.73.

7. The display substrate according to claim 1, wherein,
at least two isolation pillars including the at least one isolation pillar are provided in the isolation region, the at least two isolation pillars include an inner isolation pillar and an outer isolation pillar, the inner isolation pillar is located at as side of the outer isolation pillar close to the display region, an isolation dam is provided between the inner isolation pillar and the outer isolation pillar, and an organic encapsulation frame covering the inner isolation pillar is provided between the isolation dam and the display region.

8. A display device, comprising the display substrate according to claim 1.

9. The display device according to claim 8, wherein,
the display region comprises a first gate metal pattern and a second gate metal pattern which are arranged in a stack, and at least one of the first gate metal pattern and the second gate metal pattern is the gate electrode;
the first metal pattern is arranged in the same layer and made of the same material as the first gate metal pattern;
the second metal pattern is arranged in the same layer and made of the same material as the second gate metal pattern; and
the third metal pattern is arranged in the same layer and made of the same material as the source electrode and the drain electrode.

10. The display device according to claim 8, wherein,
the insulating film layer comprises a first insulating layer and a second insulating layer, the first insulating layer is located between the first metal pattern and the second metal pattern, and the second insulating layer is located between the second metal pattern and the third metal pattern; wherein at least one of the first insulating layer and the second insulating layer comprises a gate insulating layer, and at least another one of the first insulating layer and the second insulating layer comprises an inter-level dielectric layer and a buffer layer.

11. The display device according to claim 8, wherein,
at the first side, a difference between radial widths of metal steps formed by two adjacent metal patterns in the direction parallel to the base substrate is greater than or equal to 1 micron; and at the second side, a difference between radial widths of metal steps formed by two adjacent metal patterns in the direction parallel to the base substrate is greater than or equal to 1 micron.

12. The display device according to claim 11, wherein a thickness of a film layer for the first metal pattern is in a range of 2110 Angstroms to 2890 Angstroms; and
a thickness of a film layer for the second metal pattern is in a range of 2110 Angstroms to 2890 Angstroms.

13. The display device according to claim 12, wherein the insulating film layer comprises a first insulating layer and a second insulating layer, the first insulating layer is located between the first metal pattern and the second metal pattern, and the second insulating layer is located between the second metal pattern and the third metal pattern; wherein at least one of the first insulating layer and the second insulating layer comprises a gate insulating layer, and at least another one of the first insulating layer and the second insulating layer comprises an inter-level dielectric layer and a buffer layer;
the inter-level dielectric layer in the second insulating layer comprises a silicon oxide layer and a silicon nitride layer, a thickness of the silicon nitride layer is in a range of 2793 Angstroms to 3217 Angstroms, and a thickness of the silicon oxide layer is in a range of 1793 Angstroms to 2207 Angstroms; and
a ratio of the thickness of the film layer for the first metal pattern to the thickness of the film layer for the second metal pattern ranges from 0.73 to 1.37; a ratio of the thickness of the film layer for the first metal pattern to a thickness of a film layer for a first metal portion in the third metal pattern ranges from 3.51 to 5.78; a ratio of the thickness of the film layer for the first metal pattern to a thickness of a film layer for a second metal portion in the third metal pattern ranges from 0.35 to 0.59; a ratio of the thickness of the film layer for the first metal pattern to a thickness of a film layer for a third metal portion in the third metal pattern ranges from 2.01 to 2.87; a ratio of the thickness of the film layer for the first metal pattern to a thickness of the first insulating layer ranges from 1.63 to 2.61; a ratio of the thickness of first insulating layer to a thickness of the buffer layer in the second insulating layer ranges from 0.36 to 1.07; a ratio of the thickness of the buffer layer to the thickness of the silicon nitride layer in the inter-level dielectric layer included in the second insulating layer ranges from 0.37 to 1.11, and a ratio of the thickness of the buffer layer to the thickness of the silicon oxide layer ranges from 0.50 to 1.73.

14. The display device according to claim 8, wherein, at least two isolation pillars including the at least one isolation pillar are provided in the isolation region, the at least two isolation pillars include an inner isolation pillar and an outer isolation pillar, the inner isolation pillar is located at as side of the outer isolation pillar close to the display region, an isolation dam is provided between the inner isolation pillar and the outer isolation pillar, and an organic encapsulation frame covering the inner isolation pillar is provided between the isolation dam and the display region.

15. A method for manufacturing a display substrate, comprising:
providing a base substrate, the base substrate comprising a hole region, an isolation region surrounding the hole region, and a display region surrounding the isolation region; and
forming at least one isolation pillar within the isolation region, wherein each isolation pillar is arranged at a perimeter surrounding the hole region; a light-emitting layer covering the at least one isolation pillar is provided in the display region and the isolation region, and the at least one isolation pillar separates the light-emitting layer at a location between the hole region and the display region; and the isolation pillar comprises a plurality of layers of metal patterns and a plurality of insulating film layers, the plurality of layers of metal patterns is stacked sequentially on the base substrate, the plurality of insulating film layers covers the plurality of layers of the metal patterns, and a shape of the plurality of insulating film layers conforms to a shape of the plurality of layers of the metal patterns;
wherein the display region is provided with a thin film transistor, and the thin film transistor comprises a gate electrode, a source electrode and a drain electrode; the forming the at least one isolation pillar within the isolation region comprises:
forming, on the base substrate, a first metal pattern, a second metal pattern and a third metal pattern sequentially from a side close to the base substrate to a side away from the base substrate, by forming at least one of the first metal pattern, the second metal pattern and the third metal pattern in the same single patterning process as the gate electrode, and forming at least another one of the first metal pattern, the second metal pattern and the third metal pattern in the same single patterning process as the source electrode and the drain electrode; wherein,
the at least one isolation pillar comprises a first side and a second side, the first side is a side close to the display region, and the second side is a side close to the hole region;
the third metal pattern is a multi-layer structure; and
in the at least one isolation pillar, a radial width of the first metal pattern in a direction parallel to the base substrate, a radial width of the second metal pattern in the direction parallel to the base substrate, and a radial width of the third metal pattern in the direction parallel to the base substrate gradually reduce, such that a plurality of steps is formed at the first side and the second side.

16. The method according to claim 15, wherein,
at the first side, a difference between radial widths of metal steps formed by two adjacent metal patterns in the direction parallel to the base substrate is greater than or equal to 1 micron; and at the second side, a difference between radial widths of metal steps formed by two adjacent metal patterns in the direction parallel to the base substrate is greater than or equal to 1 micron;
a thickness of a film layer for the first metal pattern is in a range of 2110 Angstroms to 2890 Angstroms; and
a thickness of a film layer for the second metal pattern is in a range of 2110 Angstroms to 2890 Angstroms.

17. The method according to claim 16, wherein the insulating film layer comprises a first insulating layer and a second insulating layer, the first insulating layer is located between the first metal pattern and the second metal pattern, and the second insulating layer is located between the second metal pattern and the third metal pattern; wherein at least one of the first insulating layer and the second insulating layer comprises a gate insulating layer, and at least another one of the first insulating layer and the second insulating layer comprises an inter-level dielectric layer and a buffer layer;
the inter-level dielectric layer in the second insulating layer comprises a silicon oxide layer and a silicon nitride layer, a thickness of the silicon nitride layer is in a range of 2793 Angstroms to 3217 Angstroms, and a thickness of the silicon oxide layer is in a range of 1793 Angstroms to 2207 Angstroms; and
a ratio of the thickness of the film layer for the first metal pattern to the thickness of the film layer for the second metal pattern ranges from 0.73 to 1.37; a ratio of the thickness of the film layer for the first metal pattern to a thickness of a film layer for a first metal portion in the third metal pattern ranges from 3.51 to 5.78; a ratio of the thickness of the film layer for the first metal pattern to a thickness of a film layer for a second metal portion in the third metal pattern ranges from 0.35 to 0.59; a ratio of the thickness of the film layer for the first metal pattern to a thickness of a film layer for a third metal portion in the third metal pattern ranges from 2.01 to 2.87; a ratio of the thickness of the film layer for the first metal pattern to a thickness of the first insulating layer ranges from 1.63 to 2.61; a ratio of the thickness of first insulating layer to a thickness of the buffer layer in the second insulating layer ranges from 0.36 to 1.07; a ratio of the thickness of the buffer layer to the thickness of the silicon nitride layer in the inter-level dielectric layer included in the second insulating layer ranges from 0.37 to 1.11, and a ratio of the thickness of the buffer layer to the thickness of the silicon oxide layer ranges from 0.50 to 1.73.

\* \* \* \* \*